United States Patent

Reddy et al.

[11] Patent Number: 6,094,352
[45] Date of Patent: Jul. 25, 2000

[54] SEIZURE MECHANISM FOR COAXIAL CABLE CENTER CONDUCTOR

[75] Inventors: Prabhakara Reddy, The Woodlands; George W. Dubois, Conroe, both of Tex.

[73] Assignee: National Electronics Devices, Inc., Conroe, Tex.

[21] Appl. No.: 09/053,235

[22] Filed: Apr. 1, 1998

[51] Int. Cl.$^7$ ........................................... H05K 5/00
[52] U.S. Cl. ..................... 361/753; 361/740; 361/753; 361/752; 361/755; 361/759; 439/579
[58] Field of Search .................. 361/740, 753, 361/752, 755, 759; 439/579

[56] References Cited

U.S. PATENT DOCUMENTS

| | | | |
|---|---|---|---|
| 4,138,179 | 2/1979 | Miller et al. | 439/63 |
| 4,990,109 | 2/1991 | Romerein et al. | |
| 5,220,297 | 6/1993 | Crowhurst. | |
| 5,334,050 | 8/1994 | Andrews | 439/579 |
| 5,457,607 | 10/1995 | Carvalho | 361/740 |

*Primary Examiner*—Leo P. Picard
*Assistant Examiner*—Tuan Dinh
*Attorney, Agent, or Firm*—Wall Marjama Bilinski & Burr

[57] ABSTRACT

An apparatus allowing for the removal of a circuit board secured in a housing and in electrical and mechanical contact with one or more coaxial cable connectors without the need to remove any of the coaxial cable connectors from the housing. The apparatus comprises a housing having a plurality of connector means, each connector means having an opening for receiving the center conductor of coaxial cable and a circuit board having a plurality of corners with one or more of the corners having a notch. An electrically conductive retaining member has an interior surface shaped to accept the center conductor and has a threaded aperture that is capable of accepting a binding screw. The apparatus has a locking member rotatably mounted along the interior and exterior surfaces of the retaining member, the locking member rotatable between an open position and a locked position, whereby unscrewing the binding screw and rotating the locking member to the unlocked position opens the bottom of the retaining member and disconnects the center conductor disconnects the center conductor allowing the circuit board to be lifted vertically from the housing without disturbing any of the coaxial cable connectors.

5 Claims, 5 Drawing Sheets

SEIZURE MECHANISM FOR COAXIAL CABLE CENTER CONDUCTOR

FIELD OF THE INVENTION

This invention relates generally to an electromechanical assembly and more specifically to a seizure mechanism for removably coupling a coaxial cable center conductor to a circuit board enclosed in an insulating housing.

BACKGROUND OF THE INVENTION

In the cable television industry, a coaxial cable is generally used for distributing television signals from a central location to subscribers' homes. A coaxial cable is a type of transmission line in which one conductor completely surrounds the other, the two being separated by a dielectric. Such a line is characterized by a negligible external electromagnetic field and by having essentially no susceptibility to external fields from other sources.

Along the path of the distribution system from the central location to the subscribers' homes there is a need for amplifiers, filters, and other electrical components that are usually contained within insulated housings. These types of electronic functions are often times carried out by components that are mounted on printed circuit boards and, in addition, serve as useful tools in the diagnosis of any transmission problems along the cable television system.. The circuit boards and related components frequently require testing, repair or replacement and, as such, must be removed from the electrical housing in which they are secured.

The removal of the circuit board requires the technician to open the housing by removing the top or lid of the housing. The technician then must remove the screws that support the circuit board within the housing. Prior to this invention, before removing the circuit board, the technician was required to disconnect the coaxial cables from the housing in order to provide clearance for the circuit board to be removed. The disconnection of the coaxial cables is burdensome and time consuming in that the technician must remove each of the plurality of cable connectors attached to the housing. The connectors are typically threaded and tightened for a secure fit and the disconnection process requires considerable time and effort.

SUMMARY OF THE INVENTION

It is therefore an object of the present invention to improve coaxial cable seizure mechanisms.

It is another objective of the present invention to provide an easier method of removing a circuit board from an insulating housing.

It is a further objective of the present invention to dispense with the need to disturb coaxial cables that are connected to a housing while removing a circuit board from an electrical housing such as those utilized in the cable television industry.

It is another objective of the present invention to adapt the mechanism suitable for both aerial and pedestal types of mountings.

It is a further objective of the present invention to provide means to pass a higher electrical current than is obtainable by a plug-in type seizure through the use of a center conductor secured by means of a tightened screw.

These and other objects of the present invention are attained by means of an apparatus allowing for the removal of a circuit board secured in a housing and in electrical and mechanical contact with one or more coaxial cable connectors without the need to remove any of the coaxial cable connectors. The apparatus comprises a housing having a plurality of connector means, the connector means having an opening for receiving the center conductor of coaxial cable and a circuit board having a plurality of corners with one or more of the corners having a notch. An electrically conductive retaining member has an interior surface shaped to accept the center conductor and has an aperture that is capable of accepting a binding screw. The apparatus has a locking member rotatably mounted along the interior surface of the retaining member, the locking member rotatable between an open position and a locked position, whereby unscrewing the binding screw and rotating the locking member to the unlocked position disconnects the center conductor and the frame allowing the removal of the circuit board from the housing without disturbing any of the coaxial cable connectors.

BRIEF DESCRIPTION OF THE DRAWING

For a fuller understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
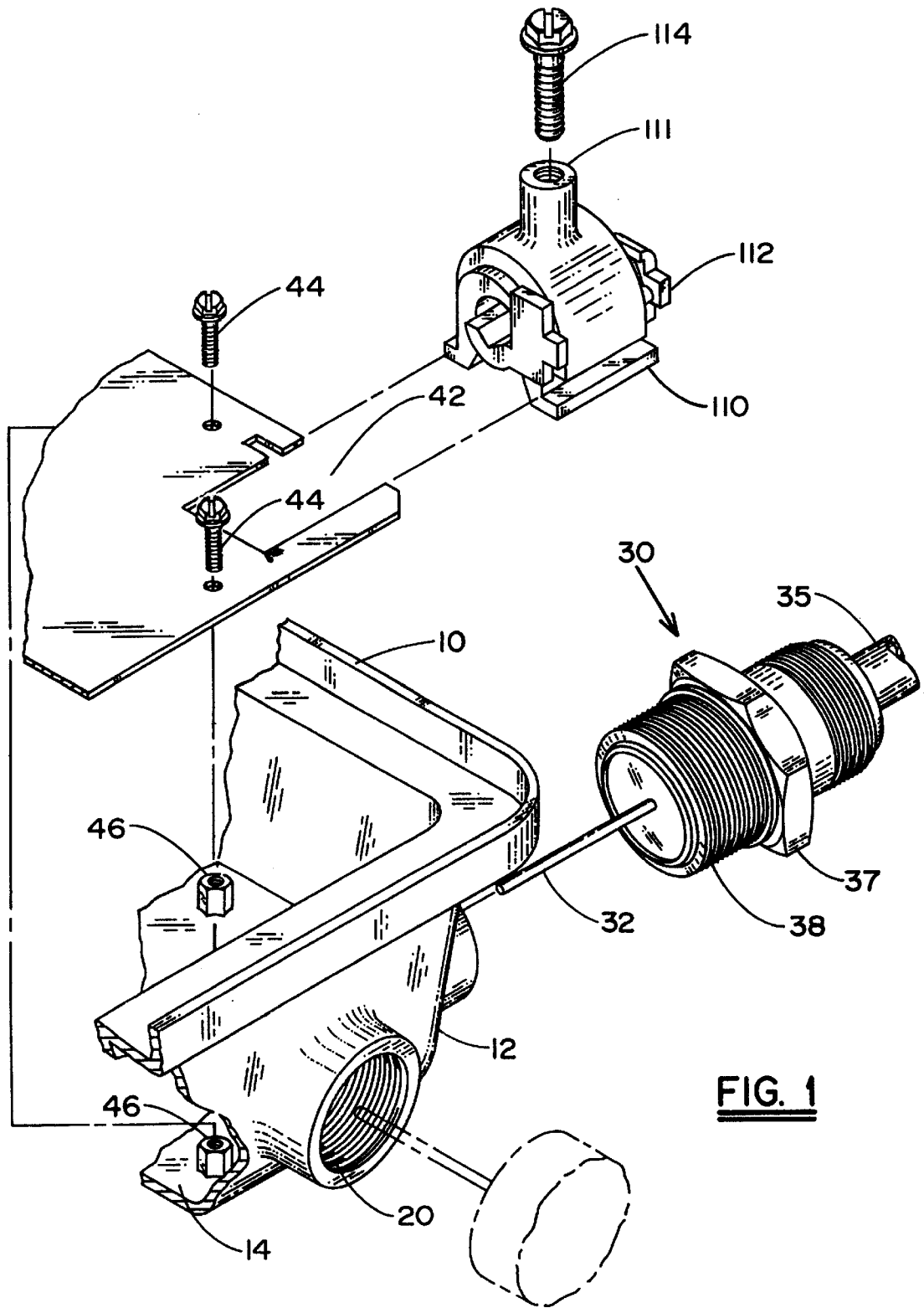
FIG. 1 is an exploded view of the seizure mechanism in a corner of the insulating housing.
Figure 2:
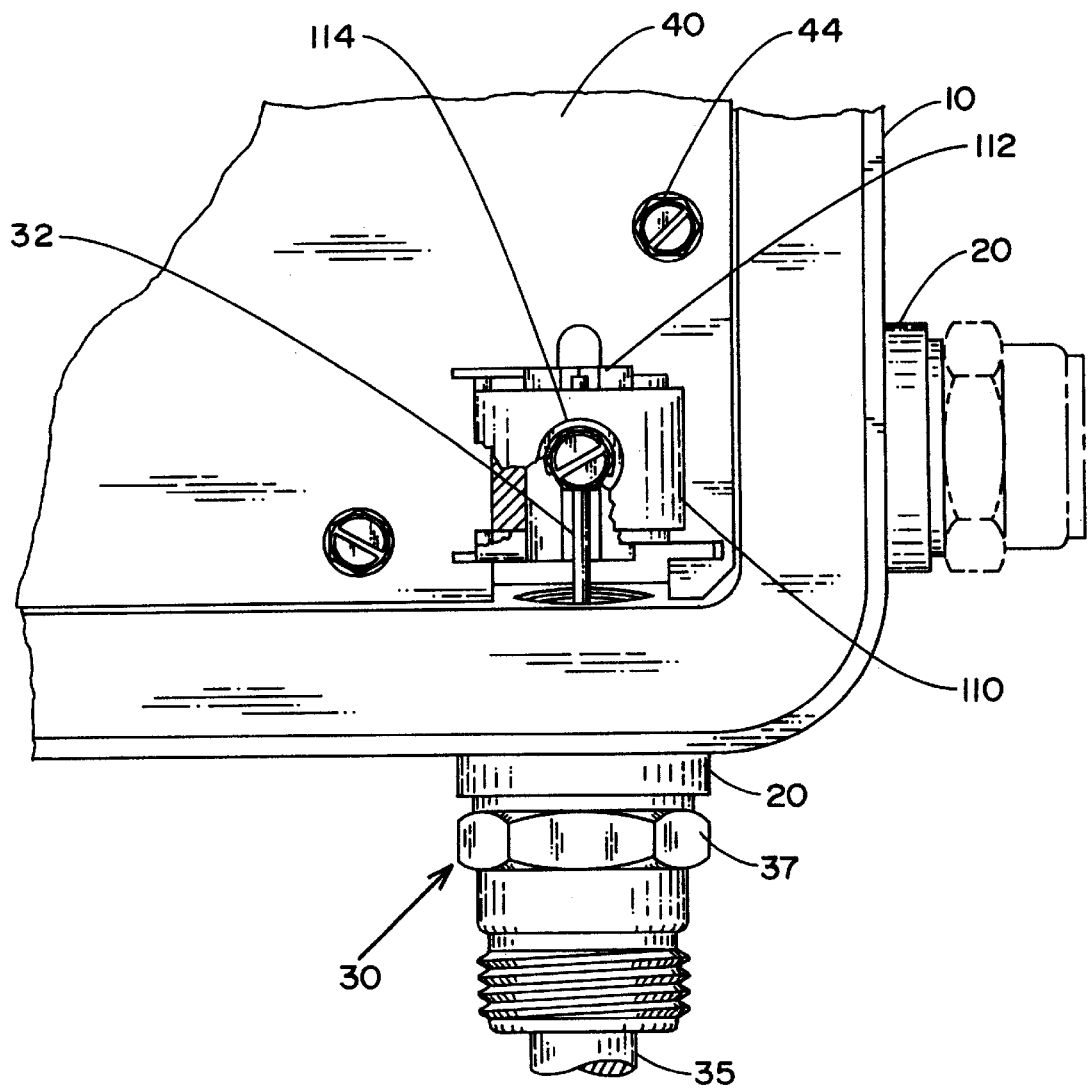
FIG. 2 is a top view of the seizure mechanism in a corner of the insulating housing.

Referring to FIGS. 1 and 2, there is shown a selected portion of a cable insulating housing 10, cast from a conductive metal such as aluminum. Typically, the housing 10 is substantially rectangular or square in shape with a bottom face 14 and a removable top face (not shown). The housing 10 has a plurality of threaded openings 20 in the lateral faces which may be arranged in various configurations. Usually, the openings 20 are placed near the corners 12 of the housing 10. In this arrangement, there are two openings 20 orthogonally arranged about each of the corners 12. The openings 20 are placed in the housing 10 according to the needs dictated by the particular installation, such as a pedestal or aerial installation.

The threaded openings 20 in the housing 10 are sized to accept coaxial cable connectors 30 with a threaded section 38. The threaded openings provide a strong coupling when tightened. The cable connector 30 also has a machined section such as a hexagonal section 37 that can accept a common wrench which allows a technician to apply sufficient torque to the connector 30 to tightly secure the connector 30 to the housing 10. The coaxial cable connector 30 is the termination point of a coaxial cable 35 and has a center conductor 32 that extends into the housing 10 while the connector 30 is coupled to the housing 10. The housing 10 is proportioned to fit a printed circuit board 40 therein with the circuit board 40 lying in a parallel plane to that of the bottom face 14 of the housing 10. The circuit board 40 is secured within the housing 10 by screws 44 which project through the circuit board 40 and through spacers 46 before piercing the bottom face 14. The spacers 46 serve to keep the circuit board 40 in place and further prevent the circuit board 40 from contacting the bottom face 14. It is understood that one skilled in the art would know various ways to secure a circuit board to a housing.

The circuit board 40 has a notch 42 that is cut out of the corner or corners of the circuit board 40. The notch or cutout 42 is cut to a shape that allows the circuit board 40 to be removed from the housing 10 such that the circuit board 40 bypasses contact with the center conductor 32 while the connector 30 is secured to the housing 10.

Figure 3:
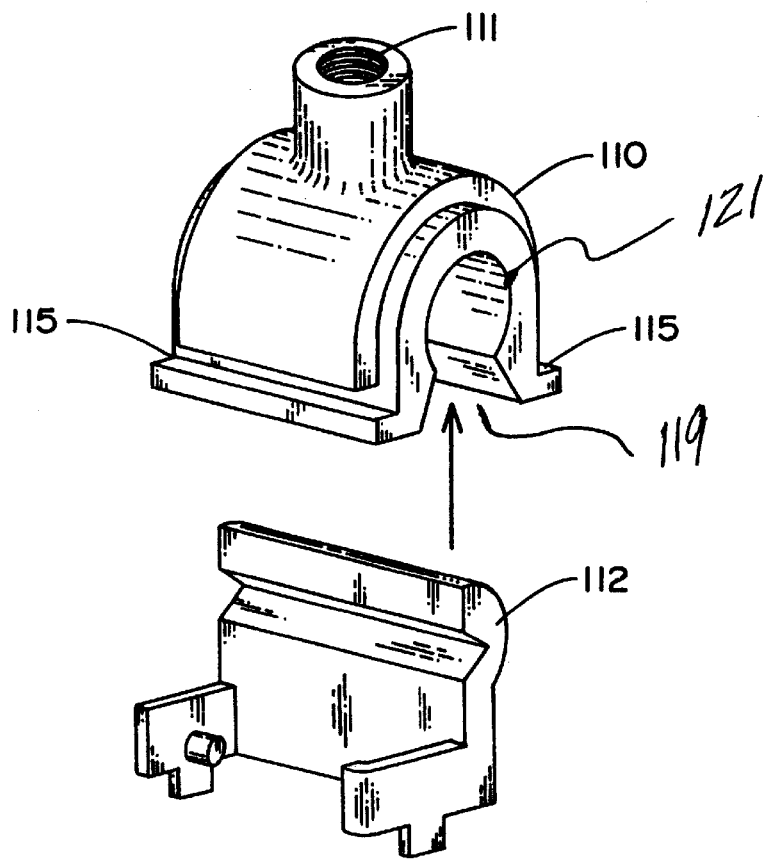
FIG. 3 is a lateral view of an unassembled embodiment of the invention.
Figure 4:
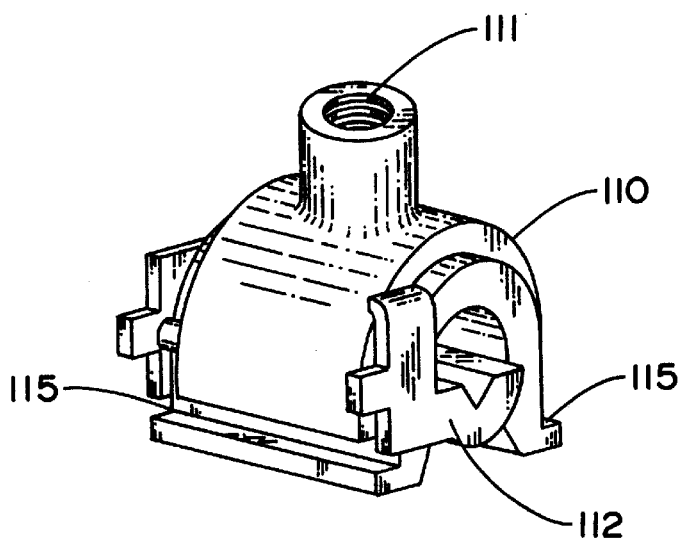
FIG. 4 is a lateral view of an assembled embodiment of the invention.
Figure 5:
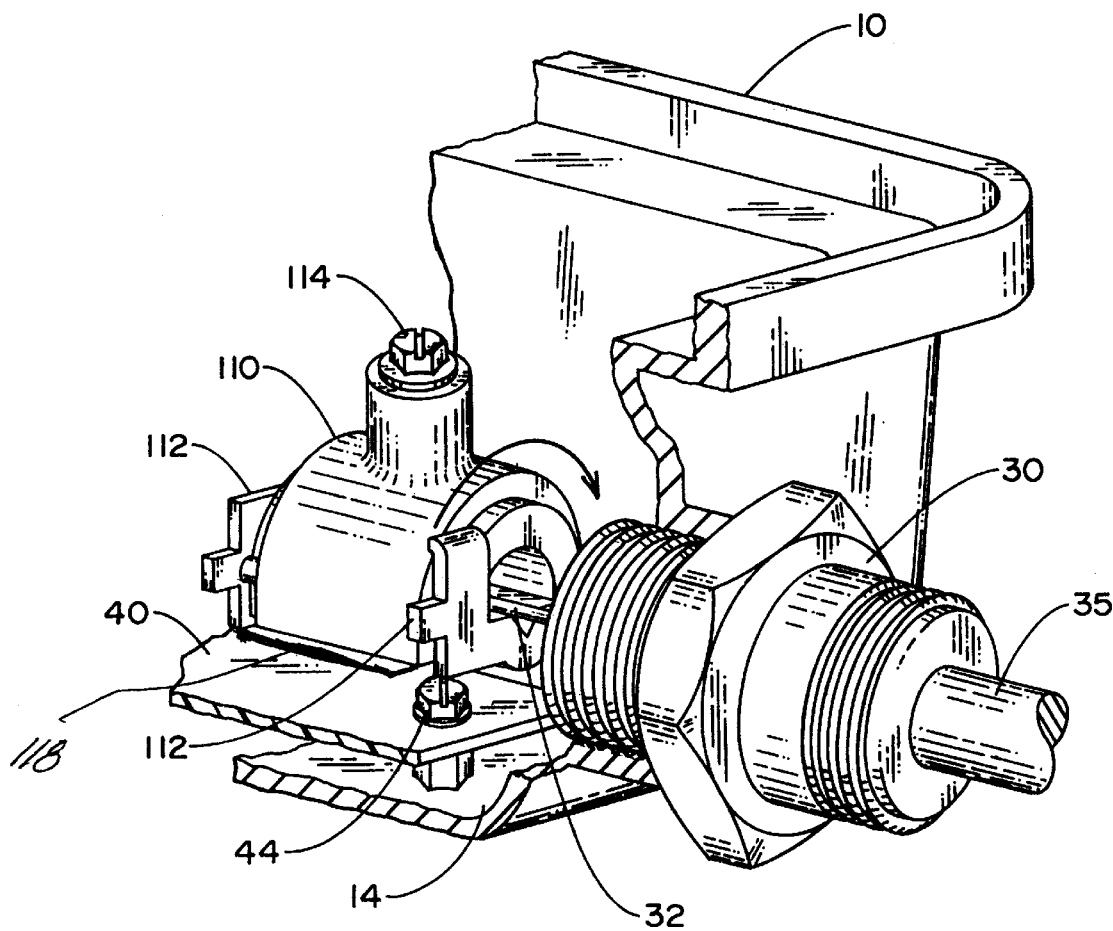
FIG. 5 is a lateral view of the embodiment of the present invention in use.

Referring now to FIGS. 3 and 4, there is shown an embodiment of the present invention. There is shown a retaining member 110 which is fabricated of a conductive material such as aluminum. The retaining member has an interior hole 121 that is adapted to receive a locking member 112. The retaining member further includes a bottom opening 119 therein that communicates with hole 121. The shape of the interior surface of the hole in the retaining member 110 is substantially cylindrical so that the locking member 112 may be inserted into the retaining member 110 in a fashion that allows for rotation of the locking member 112 between an open position (FIG. 6) and a locked position (FIGS. 4 and 5). The retaining member 110 has a threaded aperture 111 in the top surface conformed to accept a binding screw 114 (FIG. 5). There are two channels 115 that are aligned with the longitudinal axis of the cylindrical opening in the retaining member 110 which are used to slidably mount the retaining member to the circuit board 40, as depicted in FIG. 3 and 5.

FIG. 5 shows the retaining member 110 connected mechanically and electrically to the circuit board 40 with the locking member 112 deployed in the locked position. The binding screw 114 is threaded into the aperture 111 (FIG.3) in the retaining member 110 so that the binding screw 114 exerts a biasing force against the center conductor 32 and seizes the center conductor 32 to the locking member 112 when the locking member is rotated into the position shown in FIG. 5. If the circuit board 40 needs to be removed for diagnosis, repair or replacement, the user loosens the binding screw 114 and rotates the locking member 112 in the direction of the arrow. In so doing, as depicted in FIG. 6, the center conductor 32 and the coaxial cable 35 remain attached to the housing 10 and do not interfere with the removal of the circuit board 40 from the housing 10.

Figure 6:
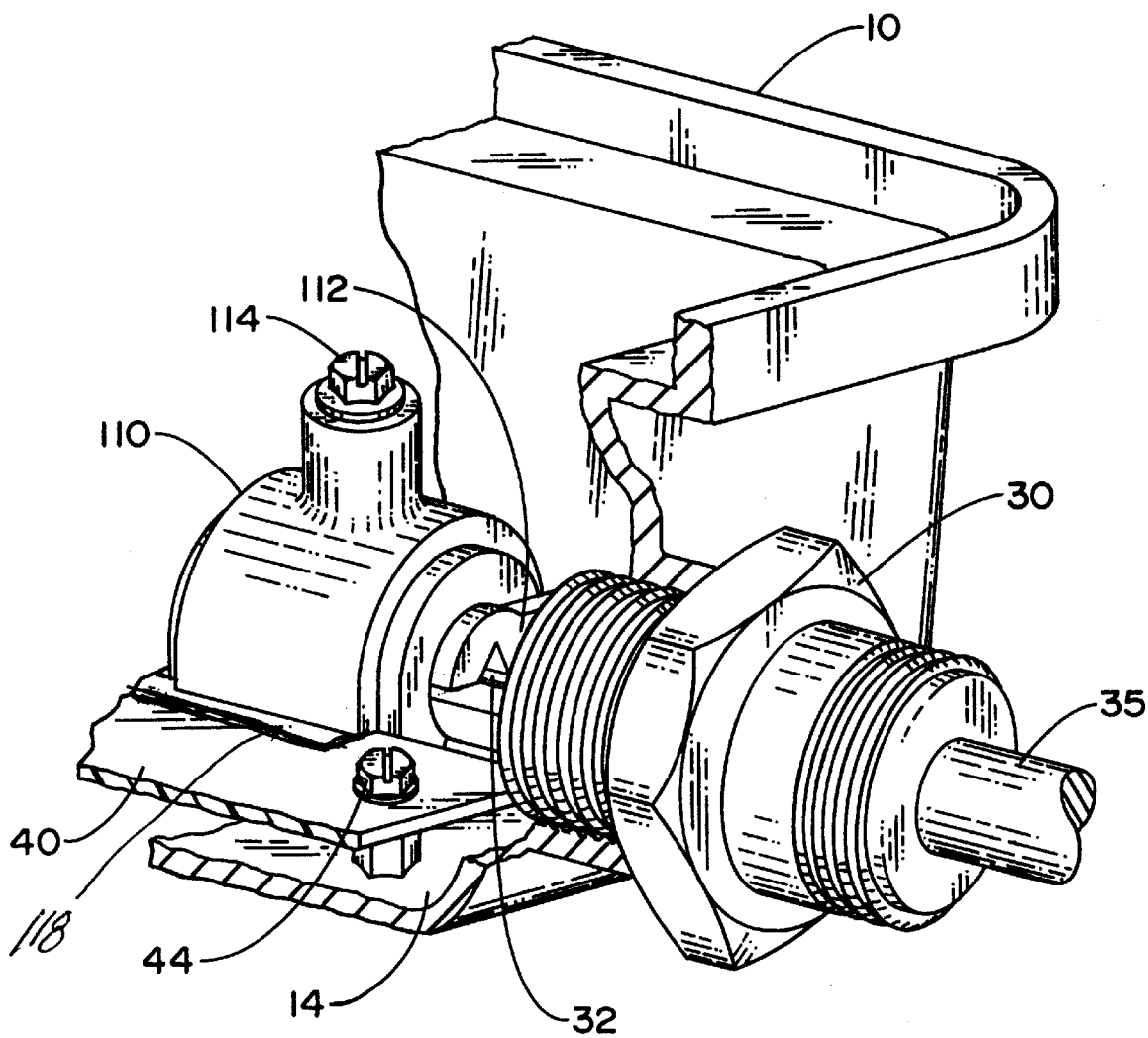
FIG. 6 is a lateral view of the embodiment of the present invention in use.

As can be seen, when the locking mechanism is rotated to the position shown in FIG. 6, the bottom opening of the retaining member 110 is opened to both the notch 42 in the circuit board and the hole 121 in the retaining member. Accordingly, the board can be lifted vertically out of the housing at which time the extended center conductor of the coaxial cable passes freely through the notch 42 provided in the corner of the circuit board.

Electrical runs 118 are provided on the circuit board adjacent to the notch 42 which comes into electric contact with the retaining member 110 when the retaining member is slidably positioned on the board. Tightening down the screw 114 forces the center conductor against the locking member placing the center conductor in positive electrical communication with the electrical run 118 on the board and thus provides for highly efficient transfer of signals between the coaxial cable and the board.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. Apparatus allowing for the removal of a circuit board from a housing without having to remove one or more coaxial cables that are connected to said housing, said apparatus including a housing containing a circuit board and having at least one connector means for securing a coaxial cable to said housing so that a center conductor of the coaxial cable passes into the housing over the top surface of said circuit board mounted in said housing;

said circuit board having a cutout formed therein that underlies said center conductor of said coaxial cable;

a retaining member mounted upon said board over said cutout, said retaining member having a bottom opening that communicates with a hole formed therein, said center conductor of said coaxial cable being received in said hole;

a locking means rotatable in said hole between a first locked position wherein the bottom opening in said retaining member is closed and the center conductor of said coaxial cable rests in electrical contact with said locking member and a second unlocked position wherein the bottom opening in said retaining means is opened to said hole allowing the circuit board to be lifted vertically from said housing past said center conductor; and electrical means for connecting the locking member in said retaining member with circuit means on said board.

2. The apparatus of claim 1 that further includes a threaded member mounted in said retaining member for securing the center conductor against the rotatable member when said rotatable member is in the locked position.

3. The apparatus of claim 2 wherein the cutout is adjacent to a corner of said housing.

4. The apparatus of claim 1 wherein said board contains a plurality of cutouts and a retaining member is mounted upon said board over each cutout.

5. The apparatus of claim 1 wherein said retaining member and said rotatable member are formed of an electrically conductive material and said retaining member is in contact with an electrical run in said board.

* * * * *